United States Patent
Gäbler

(10) Patent No.: US 11,107,851 B2
(45) Date of Patent: Aug. 31, 2021

(54) LENS LAYERS FOR SEMICONDUCTOR DEVICES

(71) Applicant: Daniel Gäbler, Apolda (DE)

(72) Inventor: Daniel Gäbler, Apolda (DE)

(73) Assignee: X-FAB SEMICONDUCTOR FOUNDRIES GMBH, Erfurt (DE)

( * ) Notice: Subject to any disclaimer, the term of this patent is extended or adjusted under 35 U.S.C. 154(b) by 91 days.

(21) Appl. No.: 16/534,179

(22) Filed: Aug. 7, 2019

(65) Prior Publication Data

US 2020/0052026 A1   Feb. 13, 2020

(30) Foreign Application Priority Data

Aug. 10, 2018 (GB) .................................. 1813110

(51) Int. Cl.
| | | |
|---|---|---|
| H01L 27/146 | (2006.01) | |
| H01L 31/0232 | (2014.01) | |
| H01L 31/054 | (2014.01) | |

(52) U.S. Cl.
CPC .. *H01L 27/14627* (2013.01); *H01L 27/14629* (2013.01); *H01L 31/02327* (2013.01); *H01L 31/0543* (2014.12)

(58) Field of Classification Search
CPC ........... H01L 31/0543; H01L 27/14627; H01L 27/14625; G02B 5/1885; G02B 5/1876–1895; G02B 3/08; G02B 3/10
See application file for complete search history.

(56) References Cited

U.S. PATENT DOCUMENTS

| | | | | |
|---|---|---|---|---|
| 4,367,366 A | * | 1/1983 | Bloss ....................... | G02B 5/32 |
| | | | | 136/246 |
| 4,418,238 A | * | 11/1983 | Lidorenko .......... | H01L 31/0549 |
| | | | | 136/246 |
| 5,121,979 A | * | 6/1992 | Cohen .................. | G02B 5/1876 |
| | | | | 351/159.44 |
| 5,121,980 A | * | 6/1992 | Cohen .................. | G02B 5/1876 |
| | | | | 351/159.41 |
| 6,010,647 A | * | 1/2000 | Nomura ........... | B29D 11/00028 |
| | | | | 264/1.8 |

(Continued)

FOREIGN PATENT DOCUMENTS

| | | | | | |
|---|---|---|---|---|---|
| JP | S62-28704 | * | 2/1987 | ........... | G02B 6/3604 |
| JP | 2002280532 A | | 9/2002 | | |

(Continued)

OTHER PUBLICATIONS

Machine translation, Moriya, Japanese Pat. Pub. No. JP S62-28704, translation date: Jan. 1, 2021, Espacenet, all pages. (Year: 2021).*

(Continued)

*Primary Examiner* — Victoria K. Hall
(74) *Attorney, Agent, or Firm* — Thompson Hine LLP

(57) ABSTRACT

A semiconductor device for light detection including a semiconductor layer having an optical active region for receiving incident light and a peripheral region around the optical active region. The device further includes a lens layer including a first lens for directing light into the optical active region, the first lens being located in a first region of the lens layer which overlaps a part but not the whole of the optical active region in the semiconductor layer.

21 Claims, 6 Drawing Sheets

(56) References Cited

U.S. PATENT DOCUMENTS

| | | | | |
|---|---|---|---|---|
| 6,046,847 | A * | 4/2000 | Takahashi | G03B 21/625 359/457 |
| 6,229,562 | B1 * | 5/2001 | Kremen | G02B 5/1885 348/51 |
| 6,399,874 | B1 * | 6/2002 | Olah | G02B 3/08 136/259 |
| 7,499,094 | B2 * | 3/2009 | Kuriyama | H01L 27/14645 348/340 |
| 7,916,204 | B2 * | 3/2011 | Wells | G02B 3/0018 348/340 |
| 9,099,580 | B2 * | 8/2015 | Hirigoyen | G02F 1/136277 |
| 9,116,271 | B2 * | 8/2015 | Tajiri | G03B 35/08 |
| 9,754,986 | B2 * | 9/2017 | Takahashi | G02B 3/08 |
| 10,249,779 | B2 * | 4/2019 | Doci | H01L 31/0543 |
| 2004/0004723 | A1 * | 1/2004 | Seko | G06F 3/03545 356/498 |
| 2004/0257460 | A1 * | 12/2004 | Kuriyama | H01L 27/14625 348/340 |
| 2005/0029433 | A1 | 2/2005 | Sakoh et al. | |
| 2005/0121071 | A1 * | 6/2005 | Repetto | F24S 23/31 136/259 |
| 2007/0035721 | A1 * | 2/2007 | Toshikiyo | G02B 3/0087 356/73.1 |
| 2007/0069108 | A1 | 3/2007 | Inaba | |
| 2007/0277869 | A1 * | 12/2007 | Shan | G02B 19/0076 136/246 |
| 2007/0284510 | A1 | 12/2007 | Li et al. | |
| 2009/0020690 | A1 * | 1/2009 | Toda | H01L 27/14685 250/227.2 |
| 2009/0141153 | A1 | 6/2009 | Onozawa | |
| 2009/0262408 | A1 * | 10/2009 | Ogasawara | G11B 7/083 359/30 |
| 2010/0214432 | A1 | 8/2010 | Nakata et al. | |
| 2010/0214456 | A1 * | 8/2010 | Tokuda | G02B 13/0085 348/294 |
| 2012/0247534 | A1 * | 10/2012 | Nakaya | F24S 23/31 136/246 |
| 2012/0260986 | A1 * | 10/2012 | Chen | H01L 31/0521 136/259 |
| 2013/0105666 | A1 * | 5/2013 | Saitou | H01L 27/14627 250/208.1 |
| 2014/0174501 | A1 * | 6/2014 | Jost | G02B 5/32 136/246 |
| 2014/0182659 | A1 * | 7/2014 | Davis | G02B 3/08 136/246 |
| 2015/0090862 | A1 * | 4/2015 | Matsui | G02B 5/1866 250/208.1 |
| 2015/0156478 | A1 * | 6/2015 | Ono | G02B 27/0075 348/49 |
| 2016/0133771 | A1 * | 5/2016 | Pelletier | H02S 40/22 136/259 |
| 2019/0191144 | A1 * | 6/2019 | Arbabi | G02B 3/08 |

FOREIGN PATENT DOCUMENTS

| | | | | |
|---|---|---|---|---|
| WO | WO-2007026588 A1 * | 3/2007 | | G11B 7/1356 |
| WO | WO 2011-112842 * | 9/2011 | | G02B 5/1885 |

OTHER PUBLICATIONS

Machine translation, Urabe, Japanese Pat. Pub. No. JP 2002-280532, translation date: Dec. 31, 2020, Espacenet, all pages. (Year: 2020).*

Abstract, Ogasawara, WIPO Pub. No. WO 2007-026588A1, Foreign Patent Retrieval Service, all pages. (Year: 2007).*

GB, Intellectual Property Office, Combined Search and Examination Report, Application No. GB2014914.2, 5 pages (dated Oct. 30, 2020).

GB, Combined Search and Examination Report under Sections 17 and 18(3); Patent Application No. GB1813110.2; 7 pages (dated Jan. 31, 2019).

* cited by examiner ated on Aug. 10, 2018, the entire contents of
LENS LAYERS FOR SEMICONDUCTOR DEVICES This application claims priority to UK application 1813110.2 filed on Aug. 10, 2018, the entire contents of which are hereby incorporated by reference.

TECHNICAL FIELD

The invention relates to improvements of semiconductor devices for light detection, and particularly to improvements in lens layers for semiconductor devices.

BACKGROUND

Integrated photo sensors are widely used in semiconductor devices for conversion of light signals into electrical signals with analog or digital signal output. Such optical sensors (e.g. Photodiodes, Image sensors or Avalanche Photodiodes) have optical active regions for converting incident light into an electric signal.

To improve the fill factor of integrated photo sensors, lenses are applied in the light path. In pixel sensors, refractive micro lenses are often used. In large area solar cells, Fresnel lenses are used instead, as refractive optics are too bulky for this application.

If a larger area is to be covered with a lens, and or multiple different sizes are required at the same time (i.e. on the same chip), established refractive micro lens processes fail. If a binary or Fresnel lens is used instead, then there are more degrees of freedom, but all manufacturing processes still impose limitations especially in terms of the minimum achievable dimensions (i.e. the critical dimension, CD). CMOS processes are limited in the achievable resolution for lithography and patterning. Binary lenses do require small features to be effective, especially for short distance and large area devices (i.e. devices having a diameter of more than a few μm).

SUMMARY

Aspects of the present invention provide semiconductor devices for light detection as set out in the accompanying claims. In one embodiment the invention is a semiconductor device for light detection including a semiconductor layer having an optical active region for receiving incident light and a peripheral region around the optical active region. The device further includes a lens layer including a first lens for directing light into the optical active region, the first lens being located in a first region of the lens layer which overlaps a part but not the whole of the optical active region in the semiconductor layer.

Certain embodiments of the invention will now be described, by way of example only, with reference to the accompanying drawings.

BRIEF DESCRIPTION OF THE DRAWINGS

FIG. 1b is a cross-sectional diagram of a part of a semiconductor device according to the embodiment of FIG. 1a;

FIG. 2b is a cross-sectional diagram of a part of a semiconductor device according to the embodiment of FIG. 2a;

FIG. 3b is a cross-sectional diagram of a part of a semiconductor device according to the embodiment of FIG. 3a;

FIG. 4b is a cross-sectional diagram of a part of a semiconductor device according to the embodiment of FIG. 4a;

DETAILED DESCRIPTION

Embodiments described herein provide lens designs for device configurations for which known lens designs may be unsuitable or difficult to manufacture. The described lens designs can improve the effective light concentration and/or manipulate the angle of incidence, without changing the given manufacturing limits. Also the embodiments can enable fixed designs for devices having flexible dimensions, which can simplify the lens layout and the manufacturing process, as well as the process control. The approach can be scaled, so that even very large areas can be covered with a lens of this kind, while no modification of the production process is required.

The purpose of a lens is to modify the light propagation along its path. The described embodiments focus on two main aspects.

The first aspect relates to how to improve the sensitivity of a photodetector. All detectors have a sensitive area (i.e. an optical active region of the device) and a footprint larger than that which includes an optically insensitive peripheral region (also referred to as the perimeter). The fill factor defines the ratio of the area of the optical active region to the whole detector area. Embodiments described herein can increase the sensitivity and improve the fill factor by bringing light incident on the peripheral region (outside the optical active region) into the optical active region. That is, the embodiments can change the light propagation from the peripheral region towards the optical active region. As the optical active region does not necessarily need a lens, the lens can be applied to the perimeter of the device only, in which case the critical dimension of the process is sufficient.

Figure 1A:
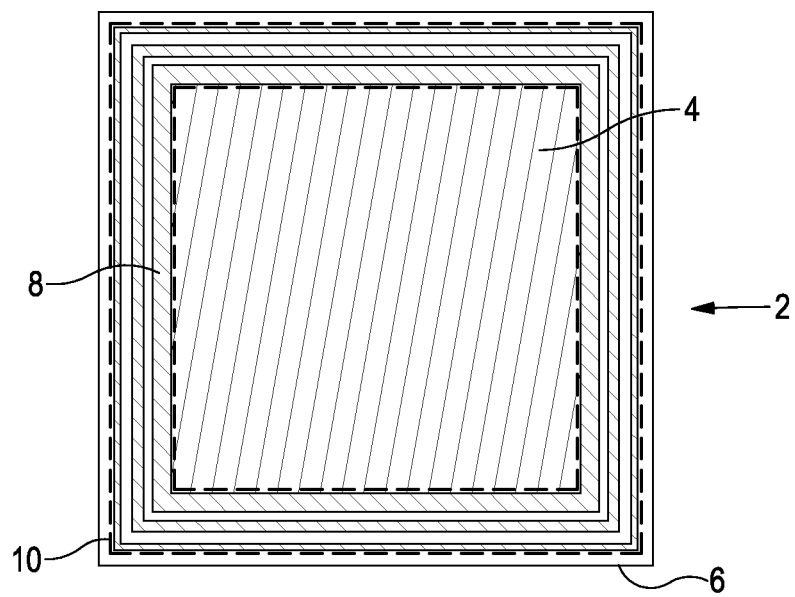
FIG. 1a is a schematic diagram of a part of a semiconductor device according to an embodiment with a peripheral binary lens.

FIG. 1a shows a top view of a part of a semiconductor device 2 according to an embodiment. The device has an optical active region 4 in the center surrounded by a peripheral region 6. A binary lens 8, having multiple elements (i.e. peaks and troughs) is located in a region 10 (between the dashed lines in FIG. 1a) overlapping the peripheral region 6, but not the optical active region 4. FIG. 1a shows the lens 8 overlapping the whole peripheral region 6 of the device 2, in other embodiments the lens 8 may overlap a part but not the whole of the peripheral region 6.

Figure 1B:
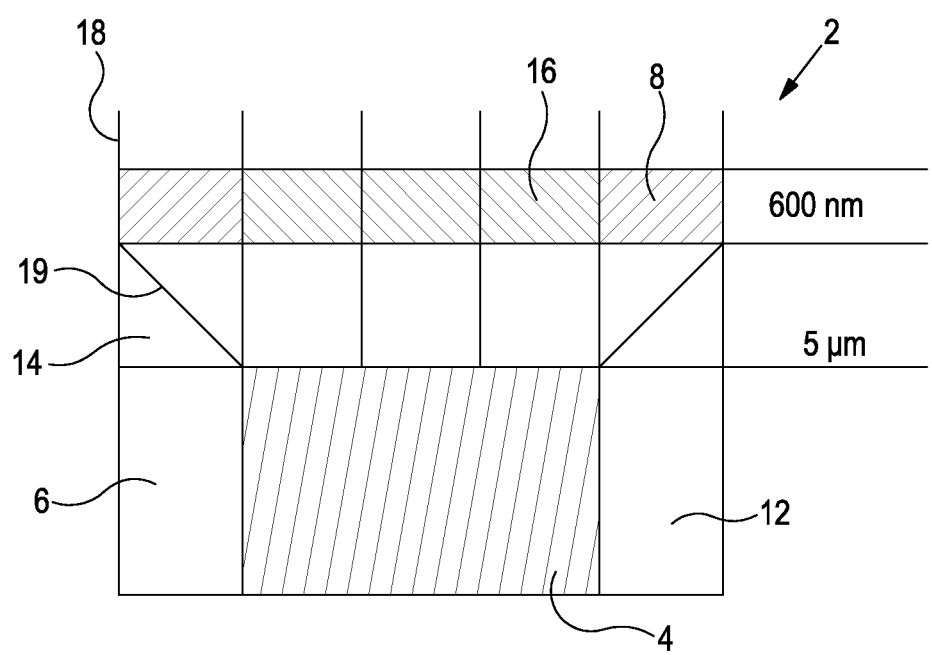

FIG. 1b shows a cross-sectional side view of a part of the semiconductor device 2 according to the embodiment. The device has a semiconductor layer 12 (typically silicon, having a refractive index of about n=3.5) with an optical active region 4 and a peripheral region 6. On top of the semiconductor layer 12 is a layer of backend dielectrics 14, which may include a plurality of dielectric and metallization layers. The layer of backend dielectrics has a thickness of 5 µm, and is covered by a nitride ($Si_3N_4$) passivation layer 16. In this embodiment, the passivation layer 16 is the lens layer (i.e. the layer in which the binary lens is formed). The passivation layer 16 has a thickness of 600 nm. A binary lens 8 is formed in the passivation layer 16 in a region which overlaps the peripheral region 6 of the semiconductor layer 12. Incident light 18 is focused by the binary lens 8 into focused light 19 incident upon the optical active region 4, where it can be detected by the semiconductor device 2. Hence, the binary lens 8 can increase the sensitivity of the device.

In the case of photodiodes, the optical active region 4 is usually quite large, whereas the insensitive perimeter is limited in extent and fixed. As a consequence, even for devices of different sizes, the perimeter stays substantially constant. Hence, a single lens design for optimal collection from the perimeter could be used for all sizes of photodiodes without requiring further modifications. Therefore a lens layout can be crafted once and then used in multiple products, which can reduce manufacturing costs. Also, the modelling of detector devices becomes easier, as the perimeter of the device is fixed, which makes modelling of flexible device sizes and shapes possible. If the binary lens is applied to the perimeter, the fill factor is increased and the lens only needs to cover a small device portion. It is enough to get the light into the optical active region, a focus to the center is not necessary. However, for light already incident on the optical active region, an oblique incidence can be a benefit, especially if the silicon surface is structured (for example with a Shallow Trench Isolation, STI, pattern). Light having an "oblique incidence" refers to light having an angle of incidence which is not normal or parallel to an interface (at the optical active region in this case).

The second aspect relates to how to modify the angle of incidence of light into the detector. The effective absorption width of detectors is limited but can be increased by oblique incidence of light. In a CMOS process, for example, a thin epi-layer is used for detection. If the light enters this layer with 45° or 60° instead of 0°, the path length is increased by 65% or 120% respectively, which causes longer wavelength light (e.g. IR radiation) to be detected more effectively. In addition, charges generated closer to the center of the active region are more likely to diffuse to the (correct) photodetector onto which the light fell. Crosstalk can therefore be suppressed by directing light into the center of the device (i.e. away from the edges of the optical active region). To achieve some of these benefits it is not necessary to focus all light to a single point. A scalable and manufacturable solution proposed herein, is to apply section lenses that cover a certain area and are repeated as often as required by the device area.

Figure 2A:
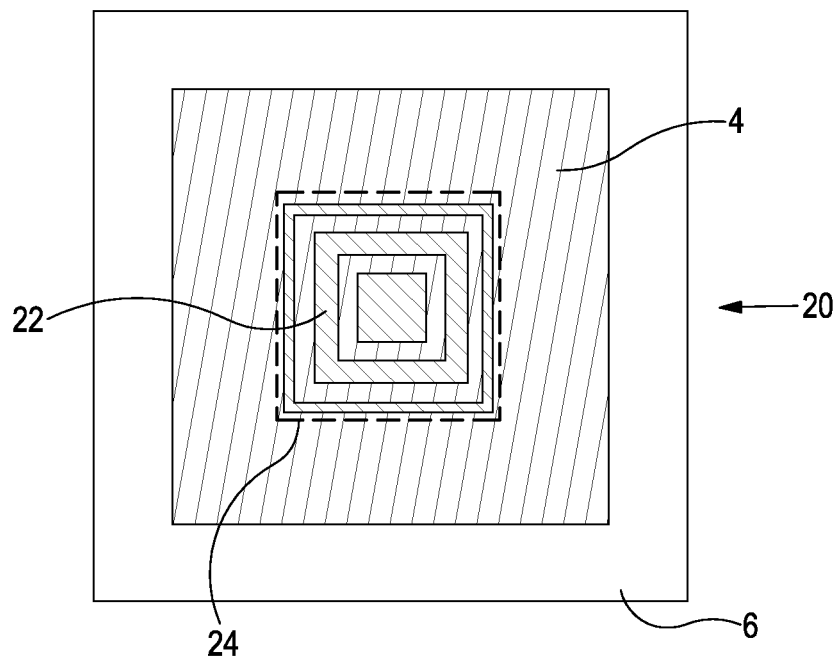
FIG. 2a is a schematic diagram of a part of a semiconductor device according to an embodiment with a central binary lens.

FIG. 2a shows a top view of a part of a semiconductor device 20 according to an embodiment. To aid understanding, similar features of embodiments illustrated in different figures have been given the same reference numerals. A single central binary lens 22 bends a portion of the light to the center under an oblique angle. The binary lens 22 is located in a region 24 (inside the dashed lines in FIG. 2a) overlapping a part of the optical active region 4. The binary lens 22 comprises consecutive etched troughs with decreasing spacing between troughs. The area of the region 24 of the binary lens 22 may hence be determined by the minimum width achievable in the manufacturing process (i.e. the CD limit).

Figure 2B:
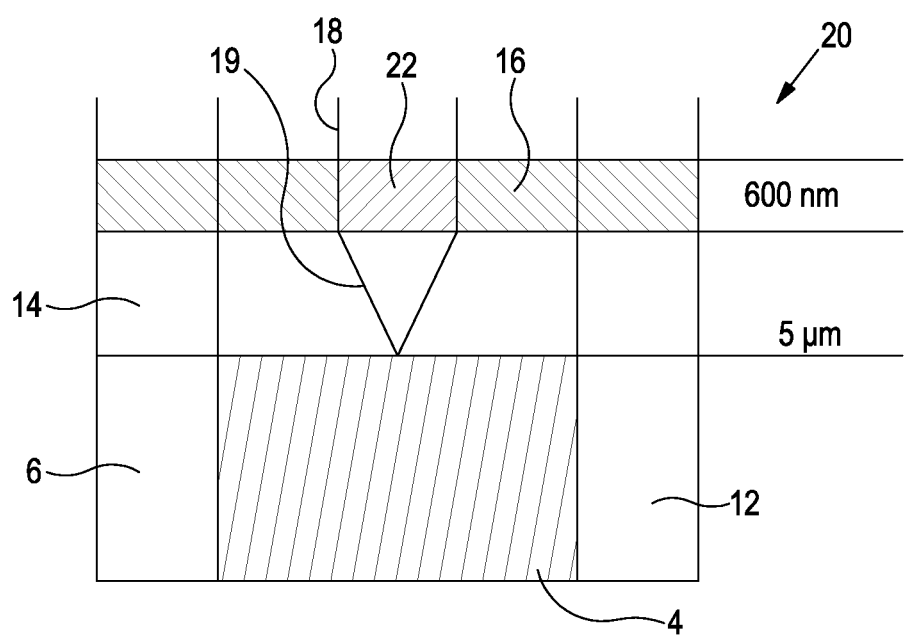

FIG. 2b shows a cross-sectional side view of a part of the semiconductor device 20 according to the embodiment. The device 20 has a semiconductor layer 12 (typically silicon, having a refractive index of about n=3.5) with an optical active region 4 and a peripheral region 6. On top of the semiconductor layer 12 is a layer of backend dielectrics 14, which may include a plurality of dielectric and metallization layers. The layer of backend dielectrics has a thickness of 5 µm, and is covered by a nitride ($Si_3N_4$) passivation layer 16. The passivation layer 16 has a thickness of 600 nm. A binary lens 22 is formed in the passivation layer 16 in a region which overlaps a part of the optical active region 4 of the semiconductor layer 12. Incident light 18 is focused by the binary lens 22 into focused light 19 incident upon the optical active region 4, thereby increasing the angle of incidence of the light 19 in the optical active region 4.

A lens can comprise multiple binary lenses, which are ideally placed concentrically and the layout of one lens stops when the CD limit is reached. Then the next lens starts until the CD limit is reached again and so forth. This pattern of consecutive lenses can continue from the center of the device out into the perimeter. The pattern of each binary lens, i.e. the widths of peaks and troughs, can be exactly repeated for each concentric lens. Each lens then causes the light to bend by an equal amount, so that light rays directed by different lenses are substantially parallel. Because the lenses are located at different distances from the center, but bend the light by substantially the same angle, the focal point of each lens is different. A lens closer to the periphery will therefore generally have a greater focal length than a lens closer to the center. The focal length is the vertical distance from the plane of the lens to its focal point. That is, individual binary lenses, having substantially the same pattern and bending angle but different focal lengths, are located (repeated) over the optical active region. Because the design of the lens is fixed in its pattern, it easier to layout, produce and control. Also the crosstalk of devices is reproducible as the light stimulus is the same for all sizes of devices, which give a much better predictability. The light is bent in an equal way across the whole optical active area and thus the same path length and light intensity is maintained regardless of the area of the device. The light is concentrated towards the center which can reduce crosstalk. Also the IR sensitivity is increased because of the longer effective absorption length in the photosensitive EPI layer, due to the increased angle of incidence. Because of the equal incidence behavior across the whole active area, the device can be scaled while the behavior stays relatively stable. If in contrast there would be one large lens or multiple lenses that focus all the light to the center (i.e. to the same point) of the device, then small devices would show a different sensitivity and crosstalk behavior compared to large ones and the lens elements would require critical dimensions LCD) that cannot be manufactured.

Figure 3A:
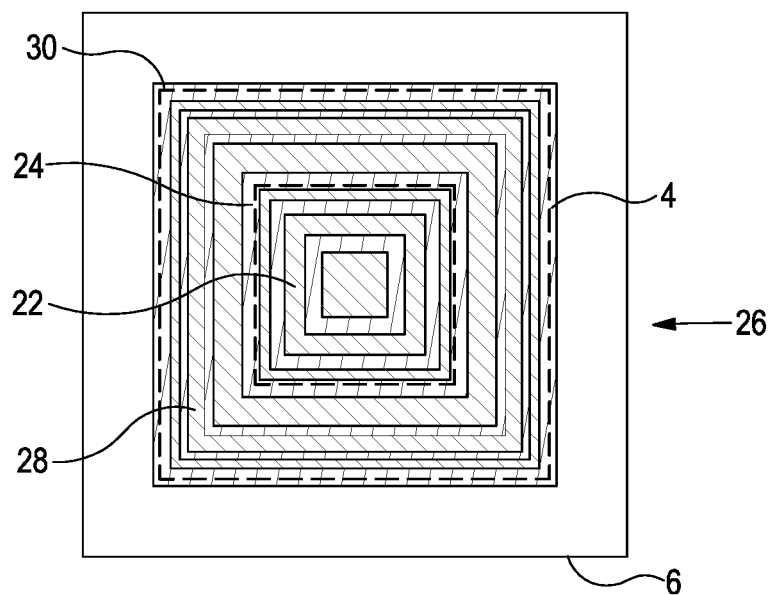
FIG. 3a is a schematic diagram of a part of a semiconductor device according to an embodiment with two central binary lenses.

FIG. 3a shows a top view of a part of a semiconductor device 26 having two binary lenses 22 and 28. The outer binary lens 28 is located in a region 30 (between the dashed lines in FIG. 3a) which also overlaps the optical active region 4. The outer binary lens 28 starts where the inner (central) element 22 stops. The focal length of the outer binary lens 28 is greater than that of the inner binary lens 22.

Figure 3B:
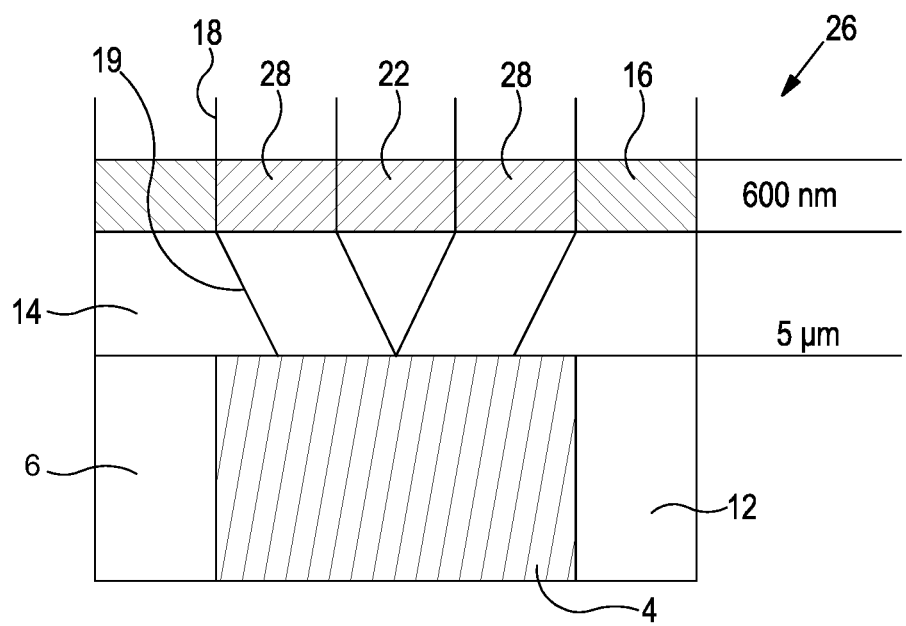

FIG. 3b shows a cross-sectional side view of the device 26. The angle of incidence produced by the two lenses 22 and 28 is substantially the same, because of the repeated binary lens pattern. Using multiple central binary lenses 22 and 28 effectively bends all light and concentrates the generated carriers away from the perimeter, thus lowering the electrical (and optical) crosstalk.

Figure 4A:
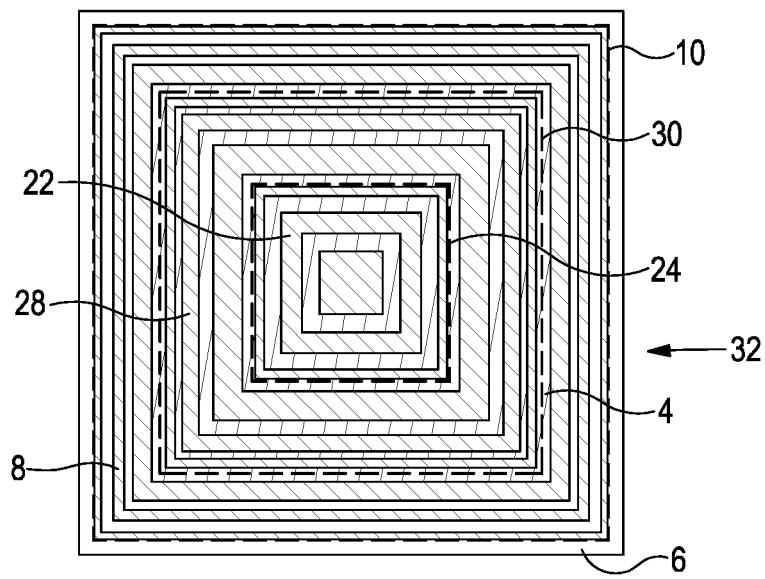
FIG. 4a is a schematic diagram of a part of a semiconductor device according to an embodiment with both central binary lenses and a peripheral binary lens.

FIG. 4a shows a top view of a semiconductor device 32 with two binary lenses 22 and 28 in regions 24 and 30 overlapping the optical active region 4 and another binary lens 8 in a region 10 overlapping the peripheral region. The embodiment illustrated in FIG. 4a combines features from the embodiments of FIGS. 1a and 3a.

Figure 4B:
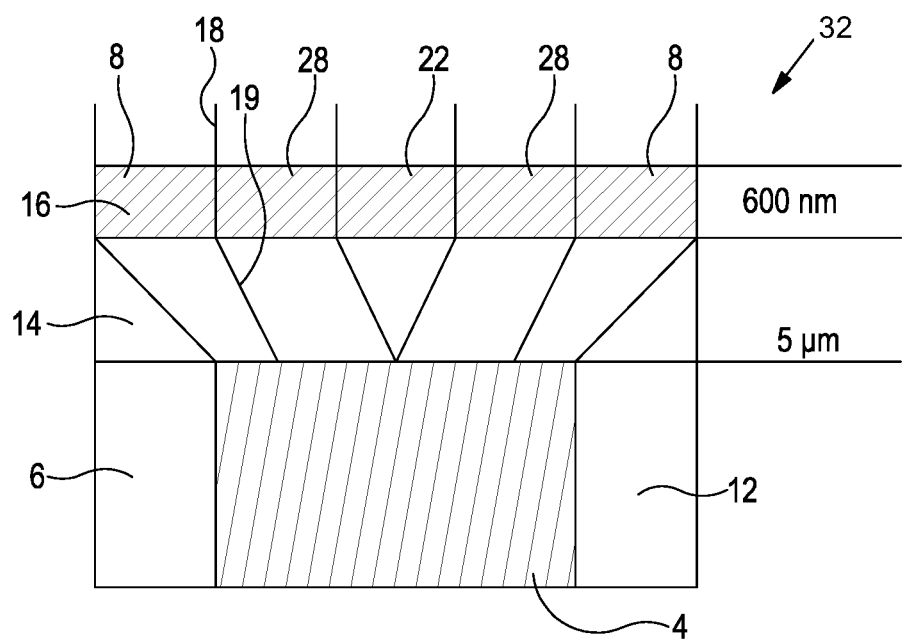

FIG. 4b shows a cross sectional side view of the device 32. The binary lenses 8, 22 and 28 are formed in the passivation layer 16 of the device 32. The inner two lenses 22 and 28 increase the angle of incidence of light already incident upon the optical active region 4. The outer binary lens 8 focuses incident light 18 into the optical active region 4, which would otherwise have been incident upon the peripheral region 6. Each of the binary lenses will in general have a different focal length.

Combining a lens at the perimeter and multiple central binary lenses can improve the fill factor, increase the IR response, lower the crosstalk and enable fabrication with the limitations of the backend and critical dimensions (CD) of a typical CMOS process.

Figure 5:
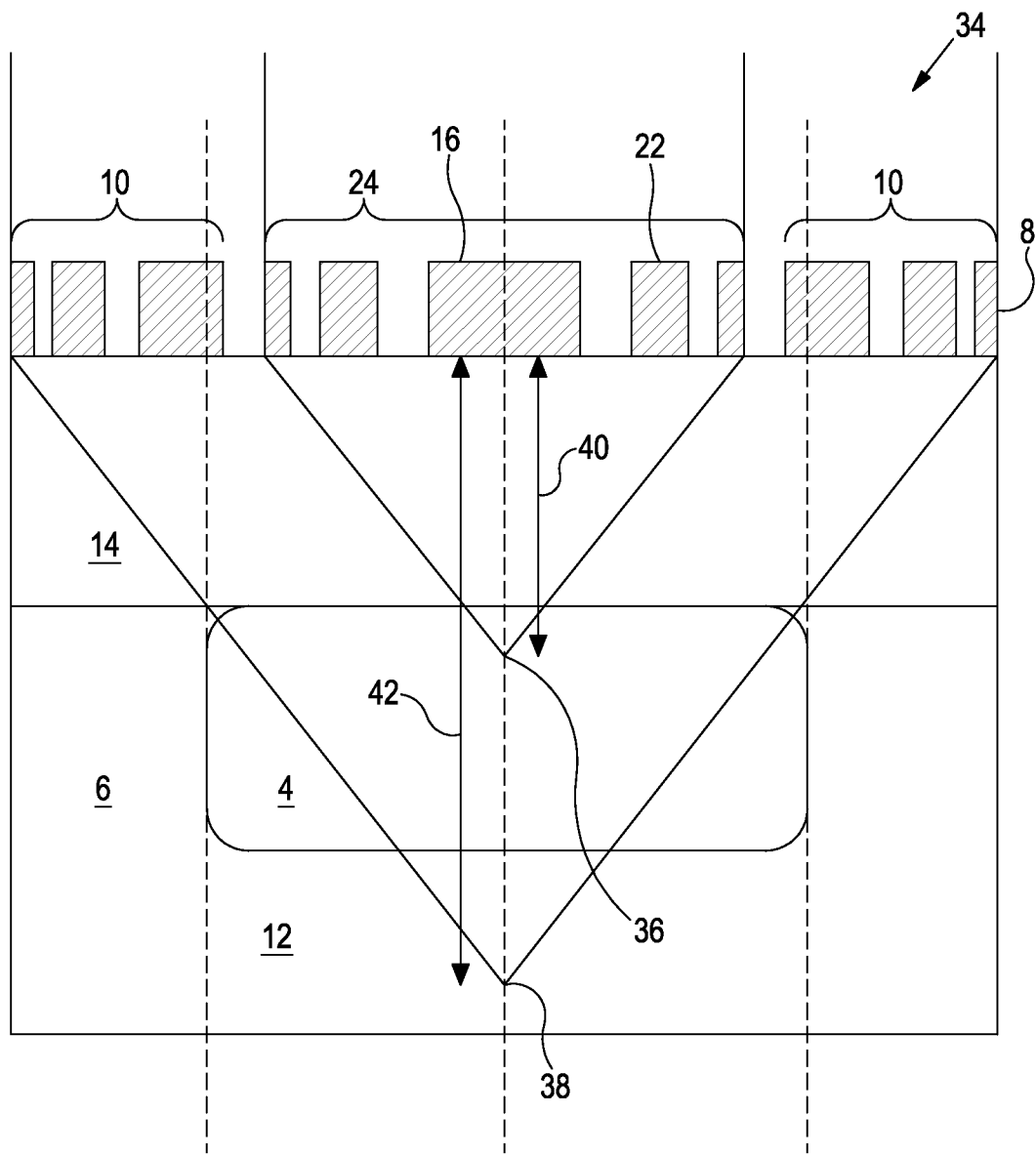
FIG. 5 is a cross-sectional diagram of a part of a semiconductor device according to an embodiment with two binary lenses.

FIG. 5 shows a cross-sectional view of a semiconductor device 34 for light detection according to another embodiment. The device 34 comprises a binary lens 22 (having multiple peaks and troughs in between) in a region 24 which overlaps a part but not the whole of the optical active region 4. The device 34 also comprises a binary lens 8 in a region 10 overlapping the peripheral region 6 as well as a part of the optical active region 4. The optical active region 4 and peripheral region 6 are in a semiconductor layer 12 (e.g. a silicon substrate). Both binary lenses 8 and 22 are formed in the nitride passivation layer 16. In other embodiments the lens layer may be a layer in the backend dielectrics layer 14. The inner binary lens 22 has a focal point 36 and the outer binary lens 8 has a different focal point 38. The focal length 40 of the inner binary lens 22 is smaller than the focal length 42 of the outer binary lens 8. The inner binary lens 22 has a Fresnel zone plate design with troughs and peaks in the nitride passivation layer 16 that decrease in width with distance away from the center. The outermost peak or trough of the lens 22 has a width at or close to the CD limit of the manufacturing process in which the device 34 was made.

Figure 6:
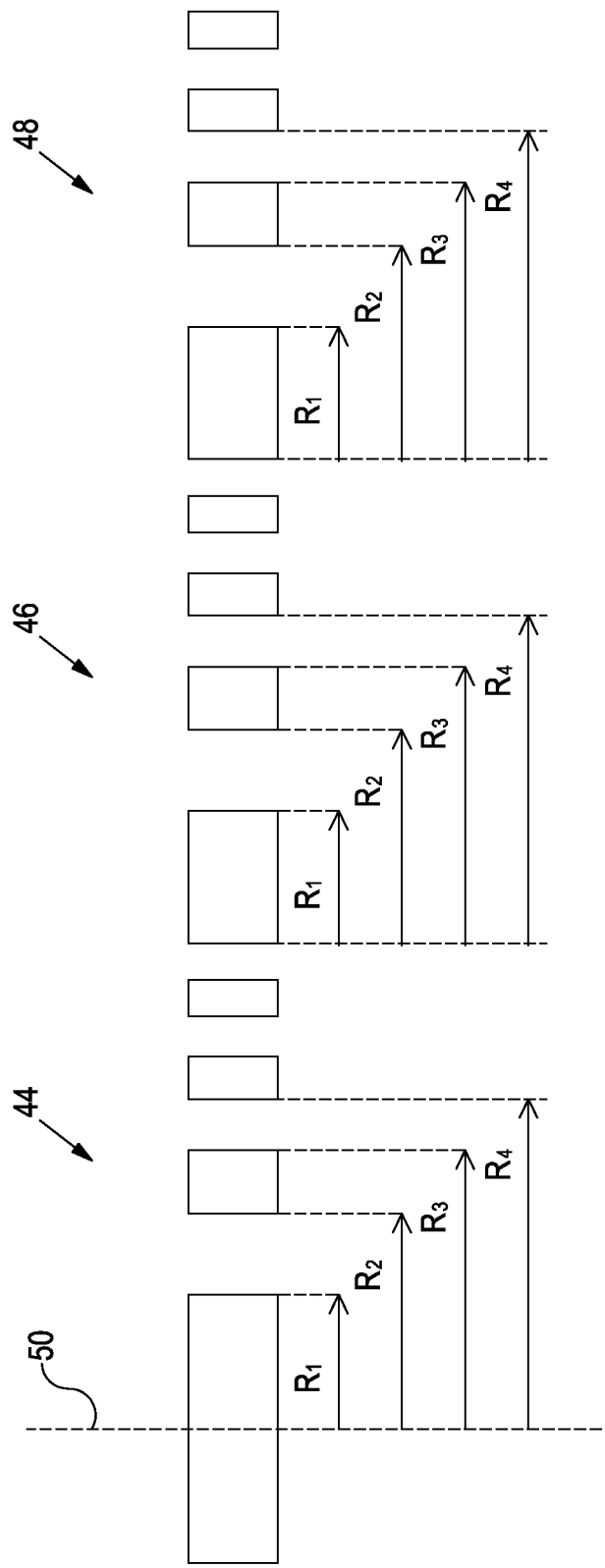
FIG. 6 is a cross-sectional diagram of a part of a semiconductor device according to an embodiment with three binary lenses having the same pattern.

FIG. 6 illustrates a part of the repeated pattern of three concentric lenses 44, 46 and 48 according to an embodiment. The first, innermost, binary lens 44 is centered over the optical active region (not shown) and has a central axis 50. The radius of the $n^{th}$ edge of a peak/trough of the first lens 44 is given by $R_n$. The radii of the first four edges of the first lens 44 are shown in the figure.

While specific embodiments of the invention have been described above, it will be appreciated that the invention as defined by the claims may be practiced otherwise than as described. The descriptions above are intended to be illustrative, and not limiting. It will be apparent to one skilled in the art that modifications may be made to the invention as described without departing from the scope of the claims set out below. For example, although the described embodiments make use of etching to form the binary lenses other possible techniques include imprint lithography and injection molding. Even spherical lenses could be formed accordingly (cut to half and arranged as described).

Each feature disclosed or illustrated in the present specification may be incorporated in the invention, whether alone or in any appropriate combination with any other feature disclosed or illustrated herein.

The invention may also be defined, in one case, according to any one of the following numbered clauses:

1. A semiconductor device for light detection comprising:
    a semiconductor layer having an optical active region for receiving incident light and a peripheral region around said optical active region; and
    a lens layer comprising a first lens for directing light into said optical active region, said first lens being located in a first region of said lens layer which overlaps a part but not the whole of said optical active region in the semiconductor layer.
2. A semiconductor device according to clause 1, further comprising a second lens for directing light into said optical active region, wherein said second lens has a focal length different from a focal length of the first lens.
3. A semiconductor device according to clause 2, wherein said second lens is located in a second region of said lens layer which overlaps a different part of said optical active region.
4. A semiconductor device according to clause 3, wherein said second region also overlaps said peripheral region of said semiconductor layer.
5. A semiconductor device according to clause 2, wherein said second lens is located in a second region of said lens layer which overlaps said peripheral region but not said optical active region of said semiconductor layer.
6. A semiconductor device according to any one of clauses 2 to 5, wherein said first and second lenses are concentric.
7. A semiconductor device according to clause 6, wherein said first and second lenses have patterns which are substantially the same, so that, when in use, light directed into the optical active region by each lens is bent by substantially the same angle.
8. A semiconductor device according to anyone of clauses 3 to 7, further comprising a third lens for directing light into said optical active region, wherein said third lens has a focal length different from the focal length of the first lens and from the focal length of the second lens, and wherein said third lens is located in a third region of said lens layer which is in between said first and second regions.
9. A semiconductor device according to clause 8, wherein said focal length of the third lens is greater than that of the first lens and less than that of the second lens.
10. A semiconductor device according to any preceding clause, wherein said semiconductor device is a Complementary Metal Oxide Semiconductor, CMOS, device.
11. A semiconductor device according to clause 10, wherein said lens layer is a patterned nitride passivation layer of said CMOS device.
12. A semiconductor device for light detection comprising:
    a semiconductor layer having an optical active region for receiving incident light and a peripheral region around said optical active region;
    a lens layer comprising a lens for directing light into said optical active region, said lens being located in a region of said lens layer which overlaps said peripheral region but not said optical active region.
13. A method of manufacturing a semiconductor device for light detection, the method comprising:
    providing a semiconductor layer having an optical active region for receiving incident light and a peripheral region around said optical active region;
    providing a lens layer on top of said semiconductor layer; and forming a first lens for directing light into said optical active region in a first region of said lens layer which overlaps a part but not the whole of said optical active region in the semiconductor layer.

14. A method according to clause 13, further comprising forming a second lens for directing light into said optical active region in said lens layer, wherein said second lens has a focal length that is different from a focal length of said first lens.

15. A method according to clause 14, wherein said second lens is formed in a second region of said lens layer which overlaps a different part of said optical active region.

16. A method according to clause 15, wherein said second region also overlaps said peripheral region of said semiconductor layer.

17. A method according to clause 14, wherein said second lens is formed in a second region of said lens layer which overlaps said peripheral region but not said optical active region of said semiconductor layer.

18. A method according to any one of clauses 14 to 17, wherein the first, and second lenses are formed such that they are concentric.

19. A method according to clause 18, wherein said first and second lenses are formed such that they have patterns which are substantially the same.

20. A method according to any one of clauses 15 to 19, further comprising forming a third lens for directing light into said optical active region, wherein said third lens has a focal length different from the focal length of the first lens and from the focal length of the second lens, and wherein said third lens is formed in a third region of said lens layer which is in between said first and second regions.

21. A method according to clause 20, wherein the first, second and third lenses are formed simultaneously by the same set of process steps.

22. A method according to any one of clauses 13 to 21, wherein said method is carried out in a Complementary Metal Oxide Semiconductor, CMOS, process.

23. A method according to clause 22, wherein said step of providing a lens layer comprises depositing a nitride passivation layer.

24. A method of manufacturing a semiconductor device for light detection, the method comprising:
providing a semiconductor layer having an optical active region for receiving incident light and a peripheral region around said optical active region;
providing a lens layer on top of said semiconductor layer; and
forming a lens for directing light into said optical active region, said lens being located in a region of said lens layer which overlaps said peripheral region but not said optical active region.

25. A semiconductor device or method according to any preceding clause, wherein the or each lens is a binary lens.

What is claimed is:
1. A semiconductor device for light detection comprising:
a semiconductor layer having an optical active region for receiving incident light and a peripheral region around said optical active region;
a lens layer comprising a first lens for directing light into said optical active region, said first lens being located in a first region of said lens layer which overlaps a part but not a whole of said optical active region in the semiconductor layer, and a second lens for directing light into said optical active region, wherein said second lens has a focal length different from a focal length of said first lens, and wherein said first and second lenses are concentric.

2. The semiconductor device according to claim 1, wherein said second lens is located in a second region of said lens layer which overlaps a part of said optical active region, the first and the second regions not overlapping.

3. The semiconductor device according to claim 2, wherein said second region also overlaps said peripheral region of said semiconductor layer.

4. The semiconductor device according to claim 1, wherein said second lens is located in a second region of said lens layer which overlaps said peripheral region but not said optical active region of said semiconductor layer.

5. The semiconductor device according to claim 2, wherein said first and second lenses have patterns which are substantially the same, so that, when in use, light directed into the optical active region by each lens is bent by substantially a same angle.

6. The semiconductor device according to claim 2, further comprising a third lens for directing light into said optical active region, wherein said third lens has a focal length different from the focal length of the first lens and from the focal length of the second lens, and wherein said third lens is located in a third region of said lens layer which is in between said first and second regions.

7. The semiconductor device according to claim 6, wherein said focal length of the third lens is greater than that of the first lens and less than that of the second lens.

8. The semiconductor device according to claim 1, wherein said semiconductor device is a Complementary Metal Oxide Semiconductor (CMOS), device.

9. The semiconductor device according to claim 8, wherein said lens layer is a patterned nitride passivation layer of said CMOS device.

10. A semiconductor device for light detection comprising:
a semiconductor layer having an optical active region for receiving incident light and a peripheral region around said optical active region; and
a lens layer comprising a lens for directing light into said optical active region, said lens being located in a region of said lens layer which overlaps said peripheral region but not said optical active region.

11. A method of manufacturing a semiconductor device for light detection, the method comprising:
providing a semiconductor layer having an optical active region for receiving incident light and a peripheral region around said optical active region;
providing a lens layer on top of said semiconductor layer;
forming a first lens for directing light into said optical active region in a first region of said lens layer which overlaps a part but not a whole of said optical active region in the semiconductor layer; and
forming a second lens for directing light into said optical active region in said lens layer, wherein said second lens has a focal length different from a focal length of said first lens, and wherein said first and second lenses are concentric.

12. The method according to claim 11, wherein said second lens is formed in a second region of said lens layer which overlaps a part of said optical active region, the first and the second regions not overlapping.

13. The method according to claim 12, wherein said second region also overlaps said peripheral region of said semiconductor layer.

14. The method according to claim 11, wherein said second lens is formed in a second region of said lens layer which overlaps said peripheral region but not said optical active region of said semiconductor layer.

15. The method according to claim 12, wherein said first and second lenses are formed to have patterns which are substantially same.

16. The method according to claim 12, further comprising forming a third lens for directing light into said optical active region, wherein said third lens has a focal length different from the focal length of the first lens and from the focal length of the second lens, and wherein said third lens is formed in a third region of said lens layer which is in between said first and second regions.

17. The method according to claim 16, wherein the first, second and third lenses are formed simultaneously by a same set of process steps.

18. The method according to claim 11, wherein said method is carried out in a Complementary Metal Oxide Semiconductor (CMOS), process.

19. The method according to claim 18, wherein said step of providing a lens layer comprises depositing a nitride passivation layer.

20. A method of manufacturing a semiconductor device for light detection, the method comprising:
    providing a semiconductor layer having an optical active region for receiving incident light and a peripheral region around said optical active region;
    providing a lens layer on top of said semiconductor layer; and
    forming a lens for directing light into said optical active region, said lens being located in a region of said lens layer which overlaps said peripheral region but not said optical active region.

21. The semiconductor device according to claim 1, wherein the first lens and the second lens are each a binary lens.

* * * * *